(12) United States Patent
Ho et al.

(10) Patent No.: US 12,183,671 B2
(45) Date of Patent: *Dec. 31, 2024

(54) HYBRID METAL LINE STRUCTURE

(71) Applicant: Taiwan Semiconductor Manufacturing Company, Ltd., Hsin-Chu (TW)

(72) Inventors: Pokuan Ho, Taipei (TW); Chia-Tien Wu, Taichung (TW); Hsin-Ping Chen, Hsinchu County (TW); Wei-Chen Chu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/313,480

(22) Filed: May 8, 2023

(65) Prior Publication Data

US 2023/0282571 A1    Sep. 7, 2023

Related U.S. Application Data

(63) Continuation of application No. 17/212,113, filed on Mar. 25, 2021, now Pat. No. 11,682,618.

(51) Int. Cl.
*H01L 23/522*   (2006.01)
*H01L 21/768*   (2006.01)
*H01L 23/528*   (2006.01)

(52) U.S. Cl.
CPC .... *H01L 23/5226* (2013.01); *H01L 21/76802* (2013.01); *H01L 21/76877* (2013.01); *H01L 23/528* (2013.01)

(58) Field of Classification Search
CPC .......... H01L 23/5226; H01L 21/76802; H01L 21/76877; H01L 23/528
See application file for complete search history.

(56) References Cited

U.S. PATENT DOCUMENTS

2020/0295017 A1    9/2020  Frougier et al.
2021/0020569 A1*   1/2021  Parikh ............... H01L 21/76877

OTHER PUBLICATIONS

Jiang et al. "Development of Electroless Co Via-Prefill to Enable Advanced BEOL Metallization and Via Resistance Reduction." 2016 IEEE International Interconnect Technology Conference / Advanced Metallization Conference (IITC/AMC), published on Jul. 11, 2016.
Non-Final Office Action dated Oct. 27, 2022 for U.S. Appl. No. 17/212,113.
Notice of Allowance dated Feb. 15, 2023 for U.S. Appl. No. 17/212,113.

* cited by examiner

*Primary Examiner* — Karen Kusumakar
(74) *Attorney, Agent, or Firm* — Eschweiler & Potashnik, LLC

(57) ABSTRACT

The present disclosure relates to an integrated chip that includes a substrate, a first metal line, and a hybrid metal line. The first metal line includes a first metal material and is within a first interlayer dielectric (ILD) layer over the substrate. The hybrid metal line is also within the first ILD layer. The hybrid metal line includes a pair of first metal segments that comprise the first metal material. The hybrid metal line further includes a second metal segment that comprises a second metal material that is different from the first metal material. The second metal segment is laterally between the pair of first metal segments.

20 Claims, 13 Drawing Sheets

HYBRID METAL LINE STRUCTURE

REFERENCE TO RELATED APPLICATION

This Application is a Continuation of U.S. application Ser. No. 17/212,113, filed on Mar. 25, 2021, the contents of which are hereby incorporated by reference in their entirety.

BACKGROUND

Modern day integrated chips contain millions of semiconductor devices. The semiconductor devices are electrically interconnected by way of back-end-of-the-line (BEOL) metal interconnect layers that are formed above the devices on an integrated chip. A typical integrated chip comprises a plurality of back-end-of-the-line metal interconnect layers including different sized metal wires vertically coupled together with metal contacts (i.e., vias).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
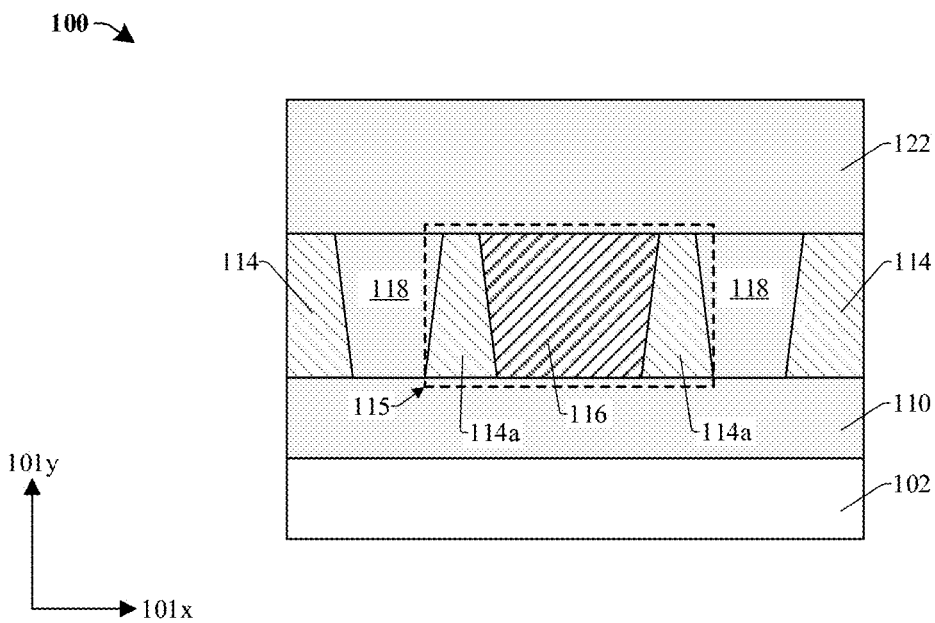
FIG. 1 illustrates a cross-sectional view of some embodiments of an integrated chip including an interconnect structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many modern integrated chips include an interconnect structure disposed over a substrate. For example, an interconnect structure may include a plurality of first metal lines comprising a first metal material. The plurality of first metal lines may be over a substrate and laterally separated by a first interlayer dielectric (ILD) layer. A plurality of vias may be over the plurality of first metal lines and laterally separated by a second ILD layer. Further, a plurality of second metal lines may be over the plurality of vias.

Some metal lines of the plurality of first metal lines may serve different purposes than other metal lines of the plurality of first metal lines. For example, some metal lines may be used to provide power to the integrated chip. Accordingly, low resistivity may be preferred in said metal lines while low resistivity may not be of the same importance in some other metal lines. Thus, different characteristics may be desired from different metal lines of the plurality of first metal lines. However, since each of the first metal lines comprise the first metal material, each of the first metal lines exhibit the same or similar characteristics. As a result, a performance of the integrated chip may be limited due to the limited material diversity of the first metal lines.

Various embodiments of the present disclosure are related to an integrated chip including an interconnect structure, the interconnect structure comprising a hybrid metal line for improving the performance of the integrated chip. A first metal line comprising a first metal material is disposed over a substrate. The hybrid metal line is laterally separated from the first metal line by a first interlayer dielectric (ILD) layer. The hybrid metal line comprises a pair of first metal segments comprising the first metal material. In addition, the hybrid metal line comprises a second metal segment disposed laterally between the pair of first metal segments. Further, the second metal segment comprises a second metal material different from the first metal material.

By including the second metal segment in the hybrid metal line, the hybrid metal line may exhibit different characteristics than the first metal line (e.g., the hybrid metal line may exhibit characteristics that depend on the second metal material). Thus, control of the characteristics of the hybrid metal line may be increased. For example, a metal having a low resistivity may be chosen for the second metal material, thereby lowering a resistance of the hybrid metal line. As a result, the performance of the hybrid metal line may be improved. In turn, the performance of the integrated chip may also be improved.

FIG. 1 illustrates a cross-sectional view of some embodiments of an integrated chip 100 including an interconnect structure, the interconnect structure comprising a hybrid metal line 115.

The integrated chip 100 comprises a substrate 102 and a dielectric layer 110 over the substrate 102. A plurality of first metal lines 114 comprising a first metal material are disposed over the dielectric layer 110. The hybrid metal line 115 is disposed over the dielectric layer 110 and may be laterally between the plurality of first metal lines 114. Further, the hybrid metal line 115 is laterally separated from the plurality of first metal lines 114 by a first interlayer dielectric (ILD) layer 118. In addition, a second ILD layer 122 may be disposed over the hybrid metal line 115 and the plurality of first metal lines 114.

The hybrid metal line 115 comprises a pair of first metal segments 114a and a second metal segment 116 between the pair of first metal segments 114a. The pair of first metal segments 114a comprise the first metal material and the second metal segment 116 comprises a second metal material different from the first metal material. Further, sidewalls of the second metal segment 116 may be disposed along sidewalls of the pair of first metal segments 114a (i.e., sidewalls of the pair of first metal segments 114a may be disposed along opposing sidewalls of the second metal segment 116). In some embodiments, the pair of first metal segments 114a may be in direct contact with the second metal segment 116 along the opposing sidewalls of the second metal segment 116.

The first metal material may, for example, comprise copper, ruthenium, tungsten, titanium, aluminum, cobalt, molybdenum, iridium, rhodium, or the like. Further, the second metal material may, for example, comprise copper, ruthenium, tungsten, titanium, aluminum, cobalt, molybdenum, iridium, rhodium, or the like.

By including the second metal segment 116 in the hybrid metal line 115, the hybrid metal line 115 may exhibit different characteristics than the plurality of first metal lines 114. Thus, by having a wide range of materials that may be included in the second metal segment 116, control of the characteristics of the hybrid metal line 115 may be increased. As a result, the performance of the hybrid metal line 115 may be improved. Thus, the performance of the integrated chip 100 may also be improved.

Although 114a is referred to as a pair of first metal segments, it will be appreciated that 114a may be a single first metal segment that appears as a pair of first metal segments when viewed in cross-section. Similarly, although 114 is referred to as a plurality of first metal lines, it will be appreciated that 114 may be a single first line that appears as a plurality of first metal lines when viewed in the cross-section.

Figure 2A:
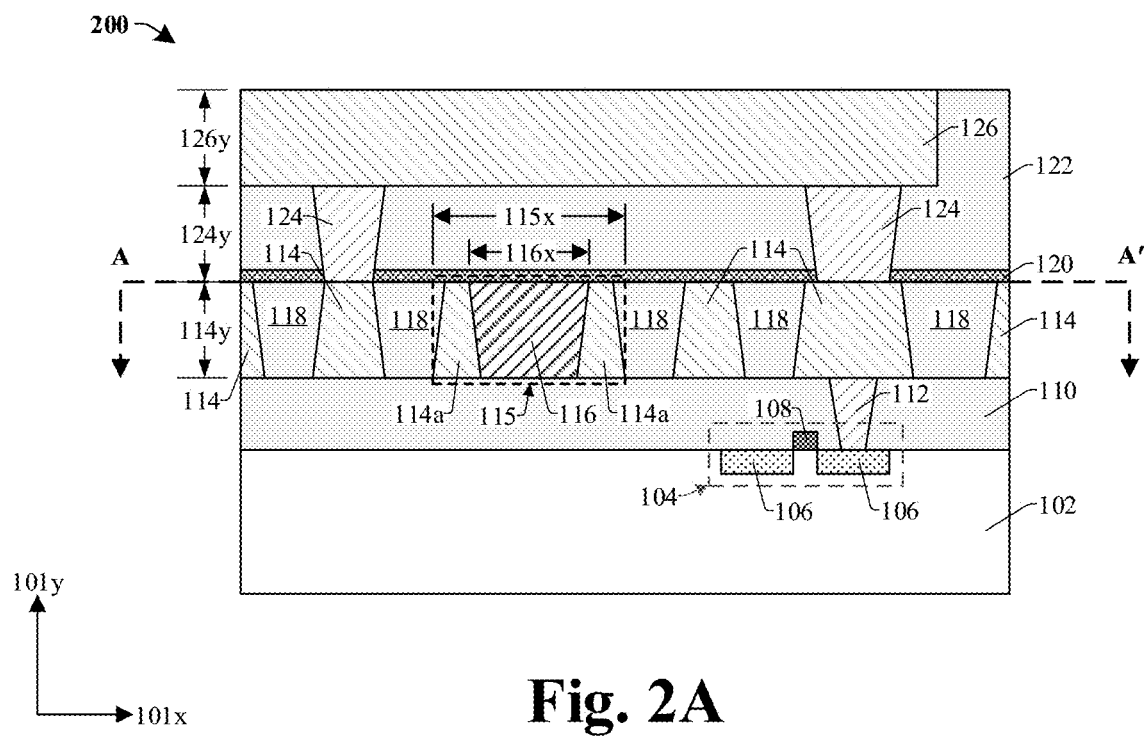
FIG. 2A illustrates a cross-sectional view of some embodiments of an integrated chip including an interconnect structure, the interconnect structure comprising a hybrid metal line.

FIG. 2A illustrates a cross-sectional view of some embodiments of an integrated chip 200 including an interconnect structure, the interconnect structure comprising a hybrid metal line 115. The cross-sectional view of FIG. 2A may, for example, be taken across line A-A' of FIG. 2B.

The integrated chip 200 comprises a semiconductor device 104 disposed over a substrate 102. A contact 112 extends through a dielectric layer 110 to the semiconductor device 104. Further, a plurality of first metal lines 114 and the hybrid metal line 115 are disposed over the dielectric layer 110 and are laterally separated from one another by a first interlayer dielectric (ILD) layer 118. An etch-stop layer 120 may be disposed over the plurality of first metal lines 114 and a second ILD layer 122 may be disposed over the etch-stop layer 120. In addition, a second metal line 126 may be disposed within the second ILD layer 122 and may extend through the second ILD layer 122 along an x-axis 101x. A plurality of vias 124 may extend from the second metal line 126 through the second ILD layer 122 and through the etch-stop layer 120 to the first metal lines 114 and/or to the hybrid metal line 115.

In some embodiments, a top surface of the second metal segment 116 may have a larger width than a bottom surface of the second metal segment 116, as measured along an x-axis 101x. As a result, angles between the sidewalls of the second metal segment 116 and the upper surface of the dielectric layer 110 may be about 60 degrees to 90 degrees, about 72 degrees to 90 degrees (i.e., angles between sidewalls of the second metal segment 116 and a bottom surface of the second metal segment 116 may be about 90 to 120 degrees or about 90 to 108 degrees), or some other suitable value. Further, top surfaces of the pair of first metal segments 114a and the plurality of first metal lines 114 may have smaller widths than bottom surfaces of the pair of first metal segments 114a and the plurality of first metal lines 114, as measured along the x-axis 101x. As a result, angles between sidewalls of the pair of first metal segments 114a and the dielectric layer 110 may be about 90 to 120 degrees, about 90 degrees to 108 degrees (i.e., angles between sidewalls of the pair of first metal segments 114a and bottom surfaces of the pair of first metal segments 114a may be about 60 to 90 degrees or about 72 to 90 degrees), or some other suitable value.

In addition, a maximum width 116x of the second metal segment 116 may be less than a maximum width 115x of the hybrid metal line 115. In some embodiments, the maximum width 116x of the second metal segment 116 may be about 10 to 90 percent of the maximum width 115x of the hybrid metal line 115, about 5 to 95 percent of the maximum width 115x of the hybrid metal line 115, or some other suitable percentage. Further, in some embodiments, each of the pair of first metal segments 114a may have the same or similar widths, while in other embodiments each of the pair of first metal segments 114a may have different widths.

The substrate 102 may, for example, comprise silicon, some other semiconductor, or the like. The semiconductor device 104 may, for example, be a metal-oxide-semiconductor field-effect transistor (MOSFET), a bipolar junction transistor (BJT), a junction field effect transistor (JFET), an insulated-gate bipolar transistor (IGBT), or the like. In some embodiments, the semiconductor device 104 may comprise a pair of source/drain regions 106 and a gate structure 108. The pair of source/drain regions 106 may, for example, comprise doped silicon or the like. The gate structure 108 may, for example, comprise polysilicon, metal, or the like.

In some embodiments, any of the dielectric layer 110, the first ILD layer 118 and the second ILD layer 122 may, for example, comprise silicon dioxide, silicon nitride, silicon carbonitride, oxygen-doped silicon carbide, nitrogen-doped silicon carbide, tetraethyl orthosilicate, some Si—O—C—H composite film, or the like. The etch-stop layer 120 may, for example, comprise silicon carbide, silicon carbonitride, silicon oxide, silicon nitride, aluminum oxynitride, aluminum oxide, oxygen-doped silicon carbide, or the like. The etch-stop layer 120 may, for example, have a thickness of about 1 to 200 angstroms, 50 to 400 angstroms, or some other suitable value.

The contact 112 may, for example, comprise tungsten, copper, aluminum, titanium, or the like. Further, the plurality of vias 124 and the second metal line 126 may comprise the same metal material or different metal materials. Any of the plurality of vias 124 and the second metal line 126 may, for example, comprise copper, ruthenium, tungsten, titanium, aluminum, cobalt, cobalt tungsten phosphide, molybdenum, iridium, rhodium, or the like.

The first metal lines 114, the first ILD layer 118, and/or the hybrid metal line 115 may have a height 114$y$ that extends along a y-axis 101$y$. The height 114$y$ may be about 100 to 500 angstroms, 500 to 1000 angstroms, or some other suitable value. Further, any of a height 124$y$ of the vias 124 and a height 126$y$ of the second metal line 126 may be about 100 to 500 angstroms, 500 to 1000 angstroms, or some other suitable value.

Figure 2B:
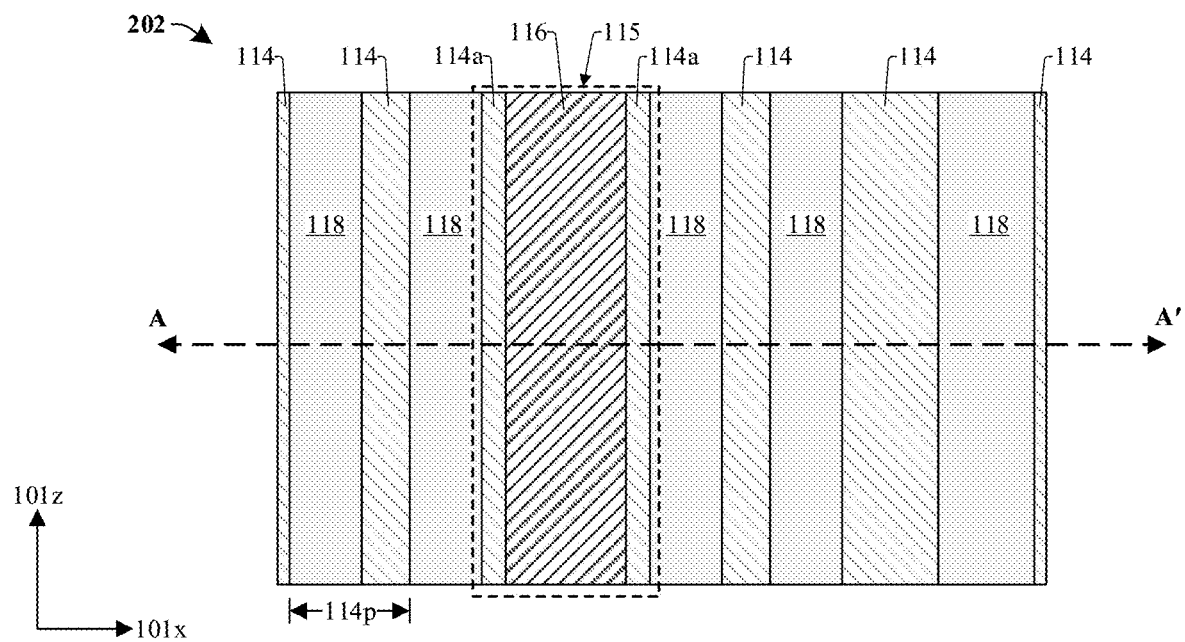
FIG. 2B illustrates a top view of some embodiments of an integrated chip including an interconnect structure, the interconnect structure comprising a hybrid metal line.

FIG. 2B illustrates a top view of some embodiments of an integrated chip 202 including an interconnect structure, the interconnect structure comprising a hybrid metal line 115.

The first metal lines 114, the hybrid metal line 115, and the first ILD layer 118 extend along a z-axis 101$z$. In some embodiments, a length of the hybrid metal line 115 along the z-axis 101$z$ may be approximately equal to a length of the first metal lines 114. In other embodiments, the hybrid metal line 115 and the first metal lines 114 may have different lengths. Further, a minimum pitch 114$p$ between the plurality of first metal lines 114 may be about 12 to 42 nanometers, about 10 to 25 nanometers, or some other suitable value. In some embodiments, the pair of first metal segments 114$a$ have ends that are aligned along the z-axis 101$z$. In other embodiments (not shown), the pair of first metal segments 114$a$ may wrap around opposing ends of the second metal segment 116 along a closed path.

Figure 3:
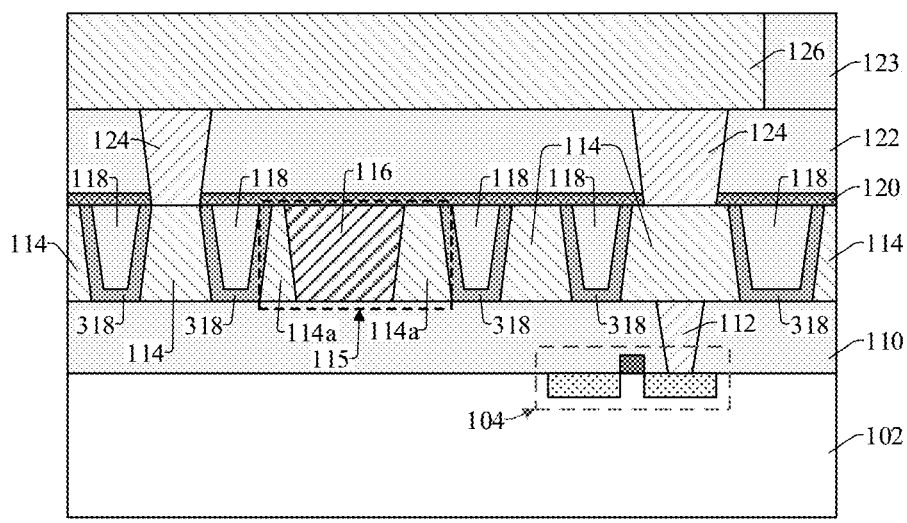
FIG. 3 illustrates a cross-sectional view of some embodiments of an integrated chip including an interconnect structure, the interconnect structure comprising a hybrid metal line and an interlayer dielectric (ILD) liner.

FIG. 3 illustrates cross-sectional view of some embodiments of an integrated chip 300 including an interconnect structure, the interconnect structure comprising a hybrid metal line 115 and an interlayer dielectric (ILD) liner 318.

In such embodiments, an ILD liner 318 may be disposed along sidewalls and lower surfaces of the first ILD layer 118. The ILD liner 318 may also be disposed along sidewalls of the first metal lines 114 and sidewalls of the pair of first metal segments 114$a$. The ILD liner 318 may laterally separate the first ILD layer 118 from neighboring first metal lines 114 or neighboring first metal segments 114$a$. Further, the ILD liner 318 may vertically separate the first ILD layer 118 from the dielectric layer 110. The ILD liner 318 may, for example, comprise silicon carbide, silicon carbonitride, silicon oxide, silicon nitride, aluminum oxynitride, aluminum oxide, oxygen-doped silicon carbide, or the like.

In addition, in some embodiments, one of the pair of first metal segments 114$a$ may have a greater width than the other first metal segment due to an overlay shift or misalignment when forming the second metal segment 116. Moreover, one sidewall of the second metal segment 116 may be closer to the first ILD layer 118 than the opposing sidewall.

In some embodiments, a third ILD layer 123 may be disposed over the second ILD layer 122. In such embodiments, the vias 124 are disposed within and extend through the second ILD layer 122 while the second metal line 126 is disposed within and extends through the third ILD layer 123.

FIGS. 4A-4D illustrate cross-sectional views of some embodiments of integrated chips 410-440 comprising hybrid metal lines 115 and different first interlayer dielectric (ILD) layers 118.

Figure 4A:
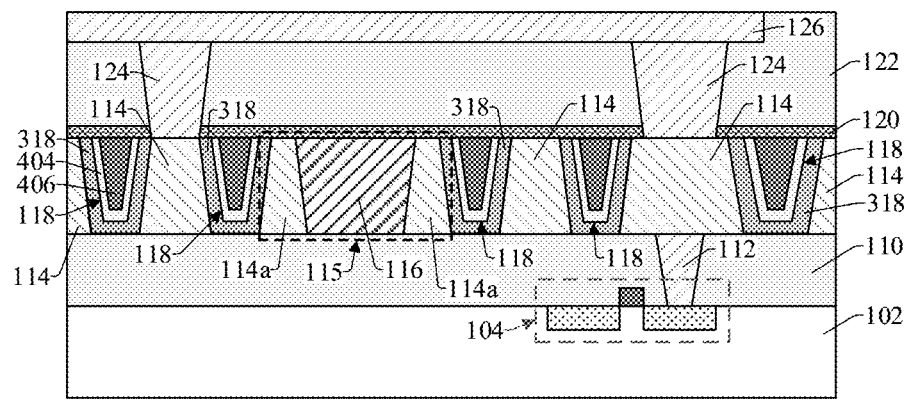
FIGS. 4A-4D illustrate cross-sectional views of some embodiments of integrated chips comprising hybrid metal lines and different first interlayer dielectric layers.

In FIG. 4A, a first ILD layer 118 comprises a first dielectric material 404 and a second dielectric material 406. The first dielectric material 404 is disposed along opposing sidewalls and a lower surface of a second dielectric material 406. Further, an ILD liner 318 may be disposed along sidewalls and a lower surface of the first ILD layer 118. By including the both the first dielectric material 404 and the second dielectric material 406 in the first ILD layer 118, more control over the dielectric characteristics (e.g., dielectric constant, mechanical strength, etc.) of the first ILD layer 118 may be achieved. Further, more control over the conformity and/or fill of the first ILD layer 118 may be achieved.

Figure 4B:
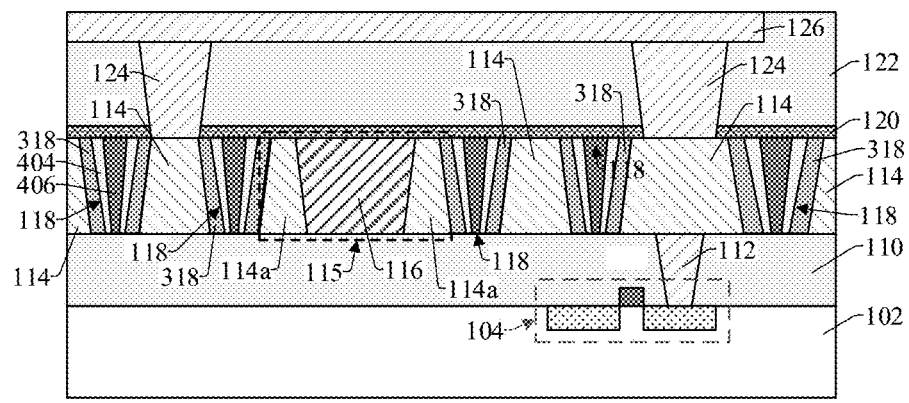

In FIG. 4B, a first ILD layer 118 comprises a first dielectric material 404 disposed along opposing sidewalls of a second dielectric material 406. Further, the second dielectric material 406 extends through the first dielectric material 404. Furthermore, an ILD liner 318 may be disposed along sidewalls, but not a lower surface, of the first ILD layer 118. By having the second dielectric material 406 extend through the first dielectric material 404, more control over the dielectric characteristics of the first ILD layer 118 at the bottom of the first ILD layer 118 may be achieved (e.g., where the plurality of first metal lines 114 are closest together).

Figure 4C:
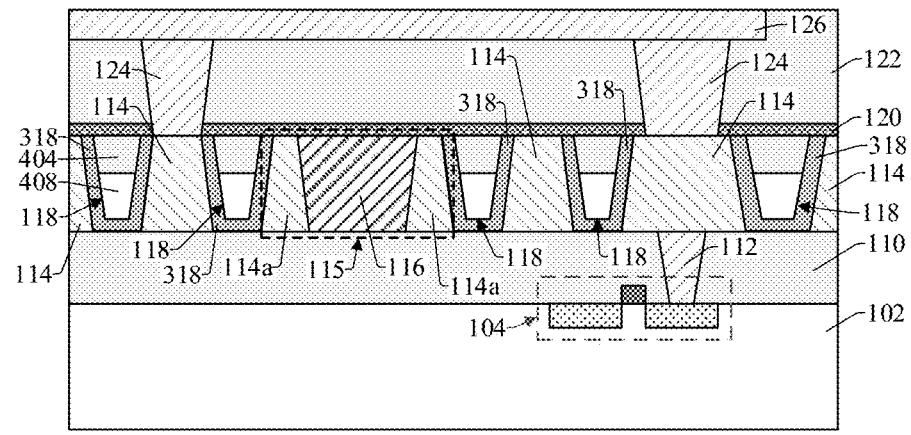

In FIG. 4C, a first ILD layer 118 comprises a first dielectric material 404 disposed over a cavity 408. Further, an ILD liner 318 may be disposed along sidewalls of the first ILD layer 118. Furthermore, the cavity 408 may be defined by sidewalls of the ILD liner 318, an upper surface of the ILD liner 318, and a lower surface of the first dielectric material 404. By including the cavity 408 below the first dielectric material 404, a dielectric constant of the first ILD layer 118 at the bottom of first ILD layer 118 (e.g., where the plurality of first metal lines 114 are closest together) may be reduced. Thus, the first ILD layer 118 may reduce a capacitance between the plurality of first metal lines 114 where the plurality of first metal lines 114 are closest together.

Figure 4D:
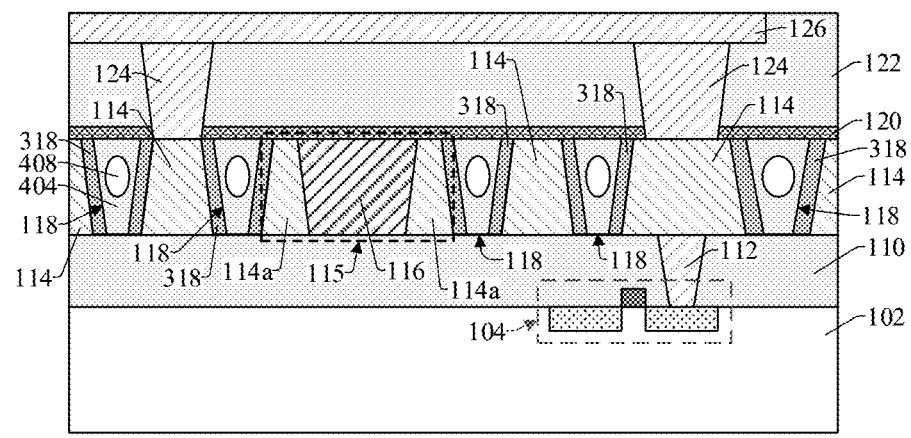

In FIG. 4D, a first ILD layer 118 comprises a cavity 408 disposed within a first dielectric material 404. The cavity 408 may be defined by one or more inner surfaces of the first ILD layer 118. Further, an ILD liner 318 may be disposed along sidewalls and a lower surface of the first ILD layer 118. By including the cavity 408 within the first dielectric material 404, an overall dielectric constant of the first ILD layer 118 may be lowered (i.e., the first ILD layer 118 may reduce a capacitance between the plurality of first metal lines 114).

Any of the first dielectric material 404 and the second dielectric material 406 may, for example, comprise silicon dioxide, silicon nitride, silicon carbonitride, oxygen-doped silicon carbide, nitrogen-doped silicon carbide, tetraethyl orthosilicate, some Si—O—C—H composite film, or the like. Further, the cavities 408 may, for example, comprise air, other gasses, or the like. Furthermore, the cavities may occupy about 20 to 90 percent of the volume of the first ILD layer 118, about 10 to 95 percent of the volume of the first ILD layer 118, or some other suitable volume of the first ILD layer 118.

Figure 5:
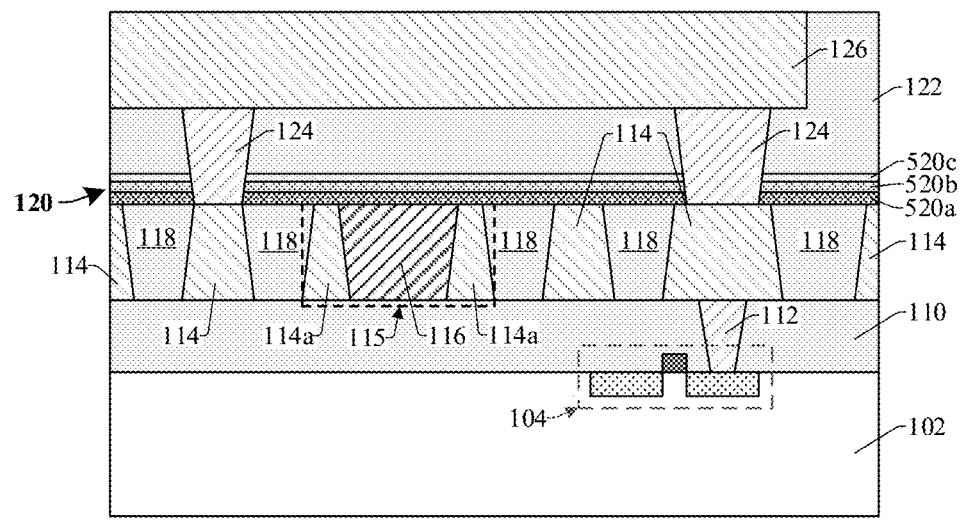
FIG. 5 illustrates a cross-sectional view of some embodiments of an integrated chip including an interconnect structure, the interconnect structure comprising a hybrid metal line and an etch-stop layer having a plurality of materials.

FIG. 5 illustrates cross-sectional views of some embodiments of an integrated chip 500 including an interconnect structure, the interconnect structure comprising a hybrid metal line 115 and an etch-stop layer 120 having a plurality of materials.

In such embodiments, the etch-stop layer 120 may comprise a first etch-stop material 520a, a second etch-stop material 520b over the first etch-stop material 520a, and a third etch-stop material 520c over the second etch-stop material 520b. Each of the aforementioned etch-stop materials may be different from one another. Further, any of the aforementioned etch-stop materials may have a thickness of 3 angstroms to 200 angstroms, about 50 to 400 angstroms, or some other suitable value. In some embodiments, the first etch-stop material 520a may have a greater thickness than the second etch-stop material 520b and the second etch-stop material 520b may have a greater thickness than the third etch-stop material 520c.

Any of the aforementioned etch-stop materials may be or comprise silicon carbide, silicon carbonitride, silicon oxide, silicon nitride, aluminum oxynitride, aluminum oxide, oxygen-doped silicon carbide, or the like.

By including multiple layers in the etch-stop layer 120, the etch-stopping capability of the etch-stop layer 120 may tuned such that the selectivity of the etch may be more precisely controlled at different depths of the etch-stop layer 120.

Figure 6:
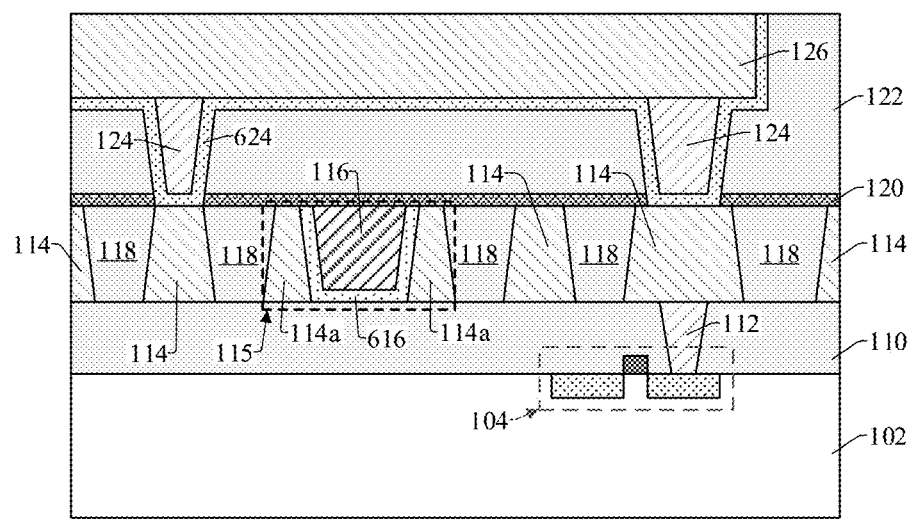
FIG. 6 illustrates a cross-sectional view of some embodiments of an integrated chip including an interconnect structure, the interconnect structure comprising a hybrid metal line and a first metal liner.

FIG. 6 illustrates a cross-sectional view of some embodiments of an integrated chip 600 including an interconnect structure, the interconnect structure comprising a hybrid metal line 115 and a first metal liner 616.

In such embodiments, a first metal liner 616 may be disposed along sidewalls and a lower surface of a second metal segment 116. The first metal liner 616 may laterally separate the second metal segment 116 from neighboring first metal segments 114a. Further, the first metal liner 616 may vertically separate the second metal segment 116 from the dielectric layer 110 and the substrate 102. The first metal liner 616 may, for example, comprise tantalum, tantalum nitride, cobalt, ruthenium, titanium, titanium nitride, manganese nitride, some self-assembled monolayer, or the like.

In some embodiments, a second metal liner 624 may be disposed along sidewalls and a lower surface of a plurality of vias 124 and/or a second metal line 126. The second metal liner 624 may laterally separate the vias 124 from a second ILD layer 122 and may vertically separate the vias 124 from underlying first metal lines 114. Further, the second metal liner 624 may laterally separate the second metal line 126 from the second ILD layer 122 and may vertically separate the second metal line 126 from the second ILD layer 122. The second metal liner 624 may, for example, comprise tantalum, tantalum nitride, cobalt, ruthenium, titanium, titanium nitride, manganese nitride, some self-assembled monolayer, or the like.

Figure 7:
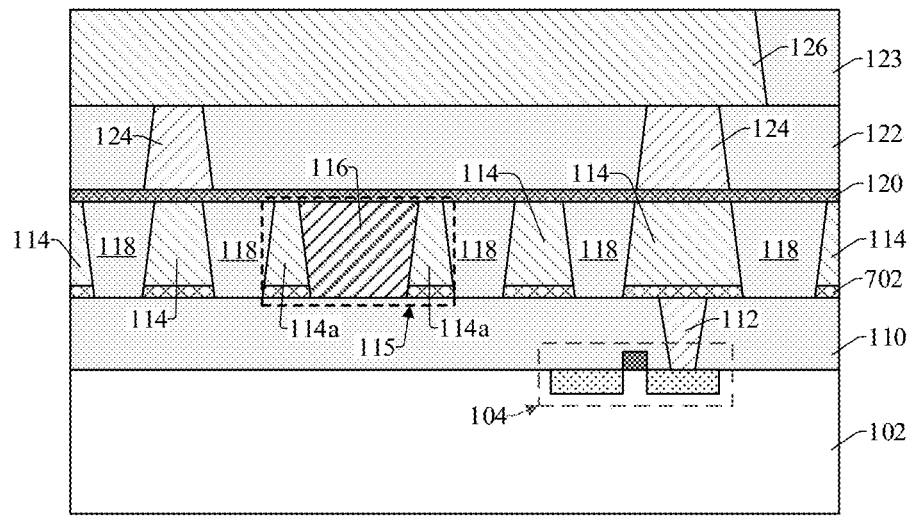
FIG. 7 illustrates a cross-sectional view of some embodiments of an integrated chip including an interconnect structure, the interconnect structure comprising a hybrid metal line and an adhesion layer.

FIG. 7 illustrates a cross-sectional view of some embodiments of an integrated chip 700 including an interconnect structure, the interconnect structure comprising a hybrid metal line 115 and an adhesion layer 702.

In such embodiments, an adhesion layer 702 may be disposed vertically between the first metal lines 114 and the dielectric layer 110. The adhesion layer 702 may improve an adhesion of the first metal lines 114 to the dielectric layer 110. The adhesion layer 702 may also be disposed vertically between the first metal segments 114a and the dielectric layer 110 but may not be disposed between the second metal segment 116 and the dielectric layer 110 (i.e., the adhesion layer 702 may be disposed along bottom surfaces of the pair of first metal segments 114a but not along a bottom surface of the second metal segment 116). As a result, the bottom surfaces of the pair of first metal segments 114a may be above the bottom surface of the second metal segment 116. Further, the adhesion layer 702 may be disposed along opposing sidewalls of the second metal segment 116.

The adhesion layer 702 may, for example, comprise tantalum, tantalum nitride, cobalt, ruthenium, titanium, titanium nitride, tungsten, aluminum, iridium, rhodium, molybdenum, manganese nitride, some self-assembled monolayer, or the like.

In some embodiments, bottom surfaces of vias 124 may have greater widths than top surfaces of the vias 124. As a result, angles between sidewalls of the vias 124 and the bottom surfaces of the vias 124 may be less than 90 degrees. Further, a bottom surface of a second metal line 126 may have a greater width than a top surface of the second metal line 126. As a result, angles between sidewalls of the second metal line 126 and the bottom surface of the second metal line 126 may be less than 90 degrees.

Figure 8A:
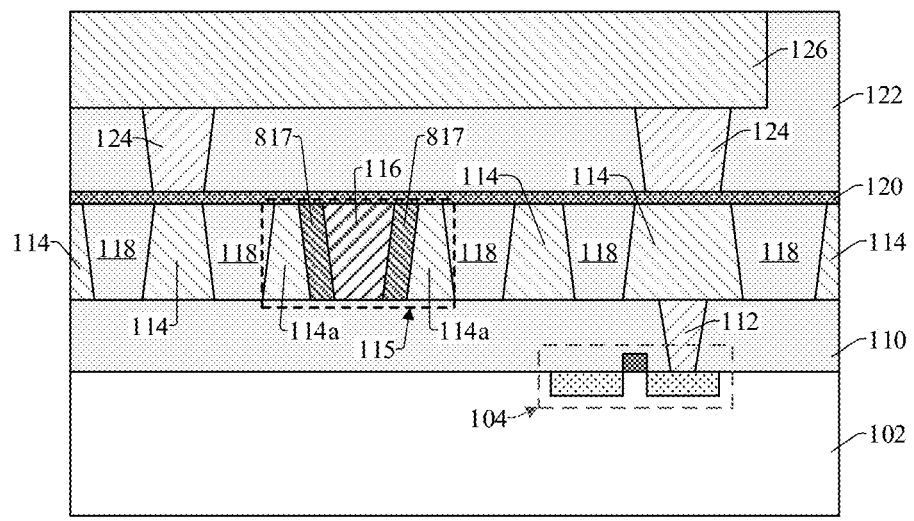
FIG. 8A illustrates a cross-sectional view of some embodiments of an integrated chip including an interconnect structure, the interconnect structure comprising a hybrid metal line including a pair of third metal segments.

FIG. 8A illustrates a cross-sectional view of some embodiments of an integrated chip 800 including an interconnect structure, the interconnect structure comprising a hybrid metal line 115 including a pair of third metal segments 817.

In such embodiments, the hybrid metal line 115 comprises a pair of first metal segments 114a, a second metal segment 116, and a pair of third metal segments 817. The pair of third metal segments 817 may be disposed along opposing sidewalls of the second metal segment 116. In addition, sidewalls of the pair of third metal segments 817 may be disposed along sidewalls of the pair of first metal segments 114a. Moreover, the pair of third metal segments 817 may laterally separate the pair of first metal segments 114a from the second metal segment 116. The second metal segment 116 may be in direct contact with the pair of third metal segments 817 and the pair of third metal segments 817 may be in direct contact with the pair of first metal segments 114a.

The pair of first metal segments 114a may comprise a first metal material. Further, the second metal segment 116 may comprise a second metal material different from the first metal material. Furthermore, the pair of third metal segments 817 may comprise a third metal material different from the second metal material and the first metal material. For example, the third metal material may comprise copper, ruthenium, tungsten, titanium, aluminum, cobalt, molybdenum, iridium, rhodium, or the like.

Although 817 is referred to as a pair of third metal segments, it will be appreciated that 817 may be a single third metal segment that appears as a pair of third metal segments when viewed in cross-section.

While FIG. 8A illustrates the hybrid metal line 115 comprising three metal segments, it will be appreciated that in some alternative embodiments (not shown), the hybrid metal line 115 may comprise more than three metal segments. The inclusion of multiple metal segments within the hybrid metal line 115 may allow for further control over characteristics of the hybrid metal line 115.

Figure 8B:
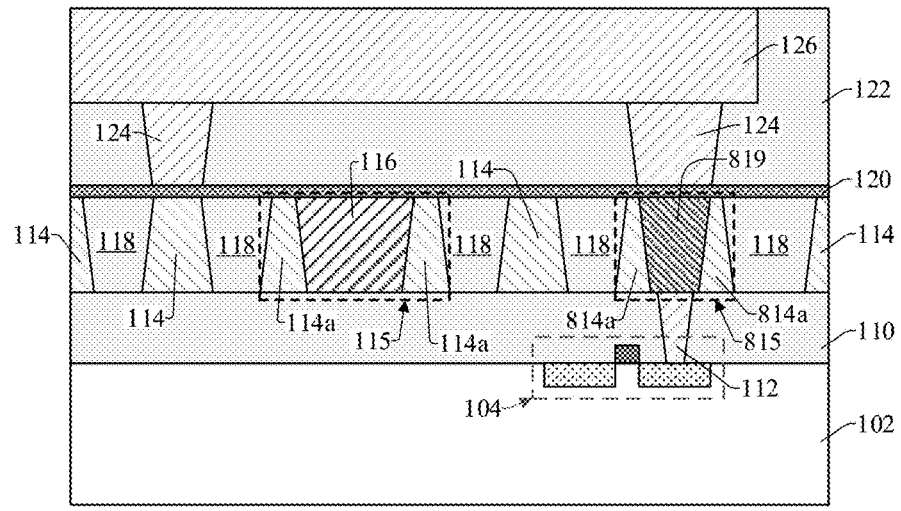
FIG. 8B illustrates a cross-sectional view of some embodiments of an integrated chip including an interconnect structure, the interconnect structure comprising a hybrid metal line and a second hybrid metal line.

FIG. 8B illustrates a cross-sectional view of some embodiments of an integrated chip 850 including an interconnect structure, the interconnect structure comprising a hybrid metal line 115 and a second hybrid metal line 815.

In such embodiments, a second hybrid metal line 815 may be laterally separated from a hybrid metal line 115. In some embodiments, the second hybrid metal line 815 may comprise a separate pair of first metal segments 814a and a third metal segment 819 between the separate pair of first metal segments 814a. The third metal segment 819 may contact the separate pair of first metal segments 814a along sidewalls of the separate pair of first metal segments 814a.

The separate pair of first metal segments 814a comprise a first metal material and the third metal segment 819 comprises a third metal material. The third metal material may be different from the first metal material and the second metal material (of which a second metal segment 116 is comprised). For example, the third metal material may comprise copper, ruthenium, tungsten, titanium, aluminum, cobalt, molybdenum, iridium, rhodium, or the like.

Having different hybrid metal lines that comprise different materials allows for the different hybrid metal lines to have different characteristics. For example, in some embodiments, the hybrid metal line 115 may have a second metal segment 116 comprising a material that is selected to provide the hybrid metal line 115 with a relatively low resistance, while the second hybrid metal line 815 may have a third metal segment 819 comprising a material that is selected to provide the second hybrid metal line 815 with low narrow-down scattering.

While FIG. 8B illustrates an integrated chip 850 comprising two hybrid metal lines (e.g., 115, 815), it will be appreciated that in some alternative embodiments (not shown), the integrated chip 850 may comprise more than two hybrid mental lines. For example, in some embodiments (not shown), the integrated chip 850 may comprise a first hybrid metal line comprising a first material, a second hybrid metal line comprising a second material, that is different than the first material, and a third hybrid metal line comprising a third material that is different than the first and second materials.

FIGS. 9-19 illustrate cross-sectional views 900-1900 of some embodiments of a method for forming an integrated chip including an interconnect structure, the interconnect structure comprising a hybrid metal line. Although FIGS. 9-19 are described in relation to a method, it will be appreciated that the structures disclosed in FIGS. 9-19 are not limited to such a method, but instead may stand alone as structures independent of the method.

Figure 9:
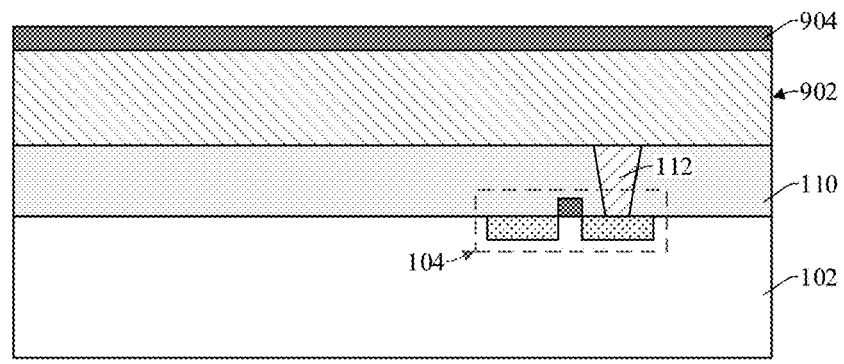
FIGS. 9-19 illustrate cross-sectional views of some embodiments of a method for forming an integrated chip including an interconnect structure, the interconnect structure comprising a hybrid metal line.

As shown in cross-sectional view 900 of FIG. 9, a first metal material 902 is deposited over a substrate 102. The substrate 102 may be any type of semiconductor body (e.g., silicon, SiGe, SOI, etc.), such as a semiconductor wafer and/or one or more die on a wafer, as well as any other type of semiconductor and/or epitaxial layers associated therewith. The first metal material 902 may, for example, be deposited by a sputtering process, an electroplating process, another suitable metal deposition process, or the like. In addition, a first hard mask 904 is formed over the first metal material 902. The first hard mask 904 may, for example, be formed by depositing titanium nitride, silicon oxide, silicon nitride, silicon oxynitride, silicon oxycarbide, tantalum nitride, silicon carbide, or the like over the first metal material 902 by chemical vapor deposition (CVD), physical vapor deposition (PVD), atomic layer deposition (ALD), a spin-on process, or the like. The first hard mask 904 may have a thickness of about 50 to 400 angstroms, about 25 to 1000 angstroms, or some other suitable value.

In some embodiments, a semiconductor device 104 may be formed in and/or on the substrate 102 prior to forming the first metal material. In some additional embodiments, a contact 112 may be formed within a dielectric layer 110 that is formed on the substrate 102 prior to forming the first metal material 902.

Figure 10:
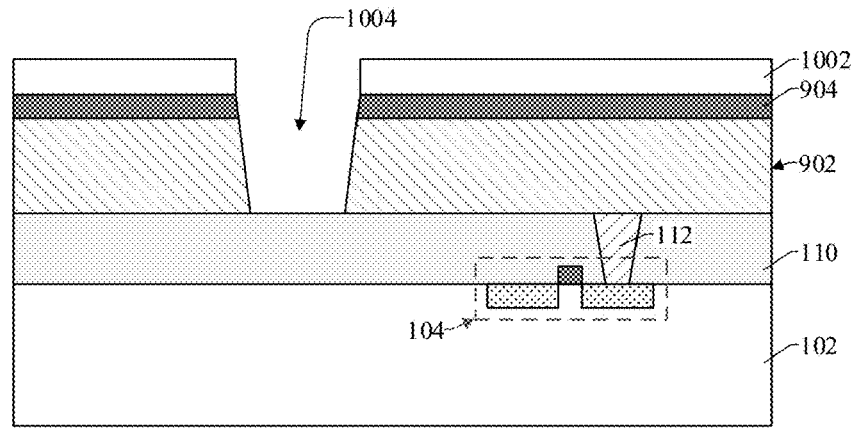

As shown in cross-sectional view 1000 of FIG. 10, a mask 1002 is formed over the first hard mask 904. Further, the first hard mask 904 may be patterned with the mask 1002 in place. In addition, the first metal material 902 may be patterned with or without the mask 1002 in place to form a first opening 1004 in the first metal material 902. The first opening 1004 may extend through the first metal material 902 to a top of a dielectric layer 110. Alternatively, in some other embodiments (not shown), the first opening 1004 may extend into the first metal material 902 to a depth that is less than a thickness of the first metal material 902. In such embodiments, the first metal material 902 is directly below the first opening 1004 after the patterning such that that the first opening 1004 is defined by sidewalls and an upper surface of the first metal material 902.

In some embodiments, the patterning may comprise a lithography process followed by a first etching process. The lithography process may, for example, comprise a lithography-etch-lithography-etch (LELE) process, a self-aligned double patterning (SADP) process, a self-aligned quadruple patterning (SAQP) process, or the like. In some embodiments, the mask 1002 may comprise photoresist or the like. In some embodiments, the first etching process may, for example, comprise a wet etching process, a dry etching process, or the like. In some embodiments, a wet etching process may utilize hydrofluoric acid, hydrochloric acid, phosphoric acid, acetic acid, nitric acid, sulfuric acid, potassium hydroxide, tetramethylammonium hydroxide, or the like. In some embodiments, a dry etching process may comprise reactive-ion etching (RIE), some other plasma etching process, or the like.

Figure 11A:
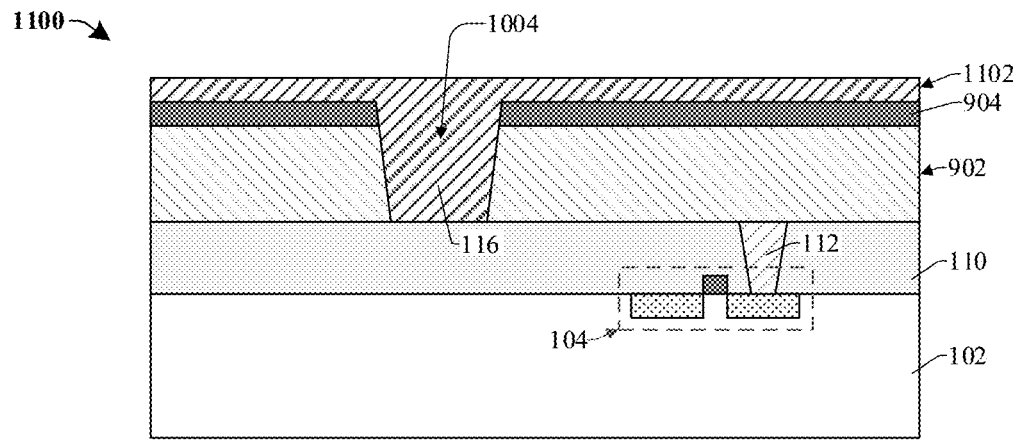

As shown in cross-sectional view 1100 of FIG. 11A, a second metal material 1102 is deposited over the first hard mask 904 and in the first opening 1004 to form a second metal segment 116 in the first opening 1004 (i.e., between sidewalls of the first metal material 902 that define the first opening 1004). The second metal material 1102 is different from the first metal material 902. The second metal material 1102 may, for example, be deposited by a sputtering process, an electroplating process, another suitable metal deposition process, or the like.

In some embodiments (not shown), the second metal segment 116 may be formed on an upper surface of the first metal material 902 due to the first opening 1004 not extending through the first metal material 902, as discussed above. In turn, the first metal material 902 may be directly below the second metal segment 116 such that a bottom surface of the second metal segment 116 may be vertically separated from a top surface of the dielectric layer 110 by the first metal material 902.

Figure 11B:
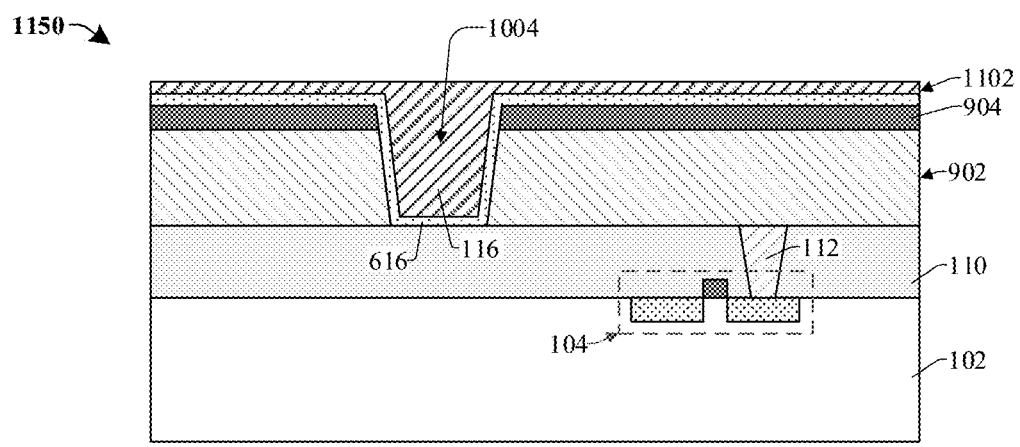

Alternatively, as shown in cross-sectional view 1150 of FIG. 11B, a first metal liner 616 may be conformally formed over the first hard mask 904 and in the first opening 1004. The second metal material 1102 may then be deposited over the first metal liner 616. The first metal liner 616 may be formed by CVD, ALD, PVD, a sputtering process, an electroplating process, or the like.

In some embodiments (not shown), the first metal liner 616 may be formed on an upper surface of the first metal material 902 due to the first opening 1004 not extending through the depth of the first metal material 902, as discussed above. In turn, the first metal material 902 may be directly below the first metal liner 616 such that a bottom surface of the first metal liner 616 that extends along a bottom surface of the second metal segment 116 may be vertically separated from a top surface of the dielectric layer 110 by the first metal material 902.

Figure 12:
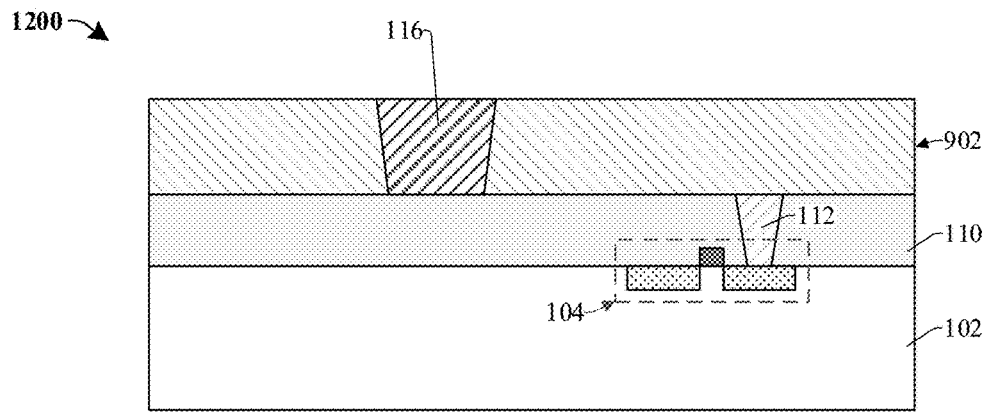

As shown in cross-sectional view 1200 of FIG. 12, a planarization process is performed on the second metal material 1102 to remove the second metal material 1102 and the first hard mask 904 from over the first metal material 902. Further, the planarization process may result in a top of the second metal segment 116 being vertically aligned with a top of the first metal material 902. The planarization process may further define the second metal segment 116. The planarization process may, for example, comprise a chemical mechanical planarization (CMP) or the like.

Figure 13:
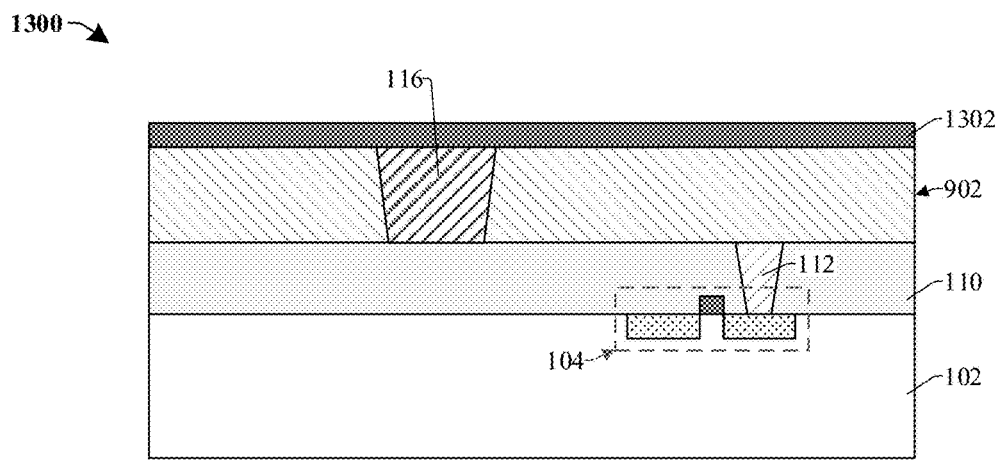

As shown in cross-sectional view 1300 of FIG. 13, a second hard mask 1302 is formed over the first metal material 902 and over the second metal segment 116. The second hard mask 1302 may, for example, be formed by depositing titanium nitride, silicon oxide, silicon nitride, silicon carbide, silicon oxynitride, silicon oxycarbide, tantalum nitride, or the like by CVD, PVD, ALD, a spin-on process, or the like. The second hard mask 1302 may have a thickness of about 50 to 400 angstroms, about 25 to 1000 angstroms, or some other suitable value.

Figure 14:
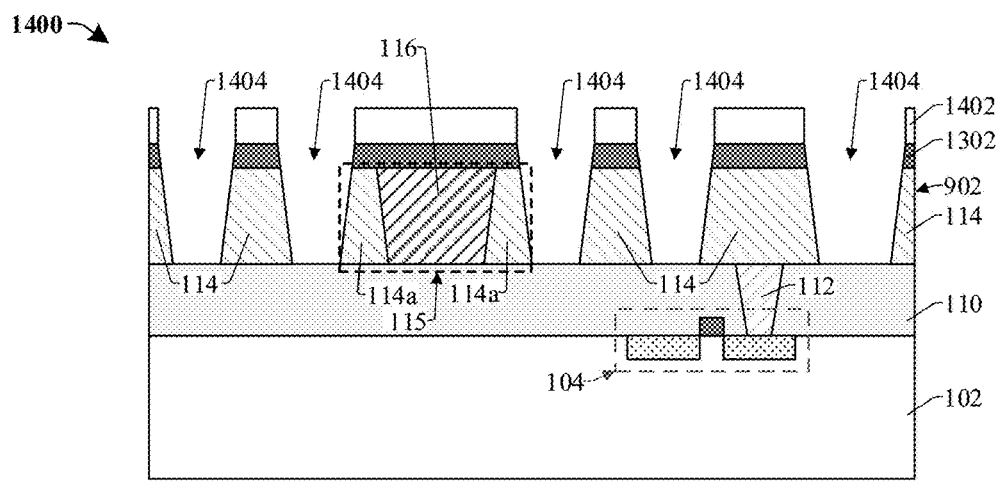

As shown in cross-sectional view 1400 of FIG. 14, a mask 1402 is formed over the second hard mask 1302. The second hard mask 1302 may be patterned with the mask 1402 in place. Further, the first metal material 902 may be patterned with or without the mask 1402 in place to form a plurality of second openings 1404 in the first metal material 902, to define a plurality of first metal lines 114, and to define a hybrid metal line 115. The patterning may comprise a second lithography process followed by a second etching process. In some embodiments, the second lithography process may comprise a lithography-etch-lithography-etch (LELE) process, a self-aligned double patterning (SADP) process, a self-aligned quadruple patterning (SAQP) process, or the like. In some embodiments, the mask 1402 may comprise photoresist or the like. In some embodiments, the second etching process may, for example, comprise a wet etching process, a dry etching process, or the like.

The hybrid metal line 115 comprises a pair of first metal segments 114a disposed along opposing sidewalls of the second metal segment 116. In some embodiments, the pair of first metal segments 114a comprise the first metal material. The plurality of second openings 1404 laterally separate the first metal lines 114 and the hybrid metal line 115. In addition, the plurality of second openings 1404 extend through the first metal material 902 to a top of the dielectric layer 110.

It has been appreciated that some metals are not able to be easily patterned and thus may not be suitable to form a patterned metal line. For example, some metals may produce non-volatile by-products during etching. The non-volatile by-products can form on surfaces of the metal during etching and impede the etching. By etching the first metal material 902 to define the hybrid metal line 115, a metal that is typically not able to be used to form a patterned metal line can be used to form the second metal segment 116 of the hybrid metal line 115 without patterning the metal. For example, a metal material (e.g., aluminum, molybdenum, tungsten, ruthenium, or the like) that may be easily patterned may be chosen as the first metal material 902 and some other metal material (e.g., copper, titanium, cobalt, iridium, rhodium or the like) with different characteristics may be chosen as the second metal material 1102 in order to tune the characteristics of the hybrid metal line 115 without having to pattern the second metal material 1102. By forming the second metal segment 116 without having to pattern it, a number of possible metals that can be used to form a metal line is increased, and an ability to improve a performance of a metal line is also increased.

Although FIG. 14 illustrates the pair of first metal segments 114a remaining on sides of the second metal segment 116 after the patterning, it will be appreciated that in some other embodiments (not shown), the patterning may remove the pair of first metal segments 114a from the sides of the second metal segment 116 such that the hybrid metal line 115 comprises the second metal segment 116 and is devoid of the pair of first metal segments 114a and hence devoid of the first metal material 902.

Figure 15A:
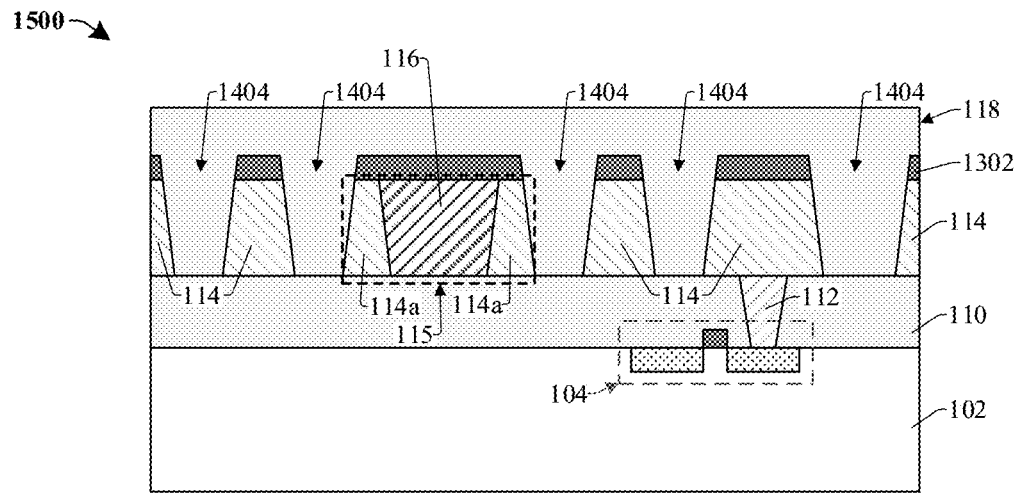

As shown in cross-sectional view 1500 of FIG. 15A, a first ILD layer 118 comprising a dielectric material is formed over the second hard mask 1302 and in the second openings 1404. The first ILD layer 118 may be formed by CVD, PVD, ALD, plasma-enhanced CVD (PECVD), a spin-on process, or the like. In some embodiments, cavities (e.g., 408 of FIGS. 4C and 4D) may exist in the first ILD layer 118 after the first ILD layer 118 is formed. The cavities may be defined by one or more inner surfaces of the first ILD layer 118. Some cavities (e.g., 408 of FIG. 4C) may be formed by depositing a sacrificial layer (not shown) in the second openings 1404 before forming the first ILD layer 118 and subsequently removing the sacrificial layer after the first ILD layer 118 is formed. Some other cavities (e.g., 408 of FIG. 4D) may be formed naturally within the first ILD layer 118 when forming the first ILD layer 118 as a result of the fill capabilities of the first ILD layer 118 and/or how conformal the deposition is.

Figure 15B:
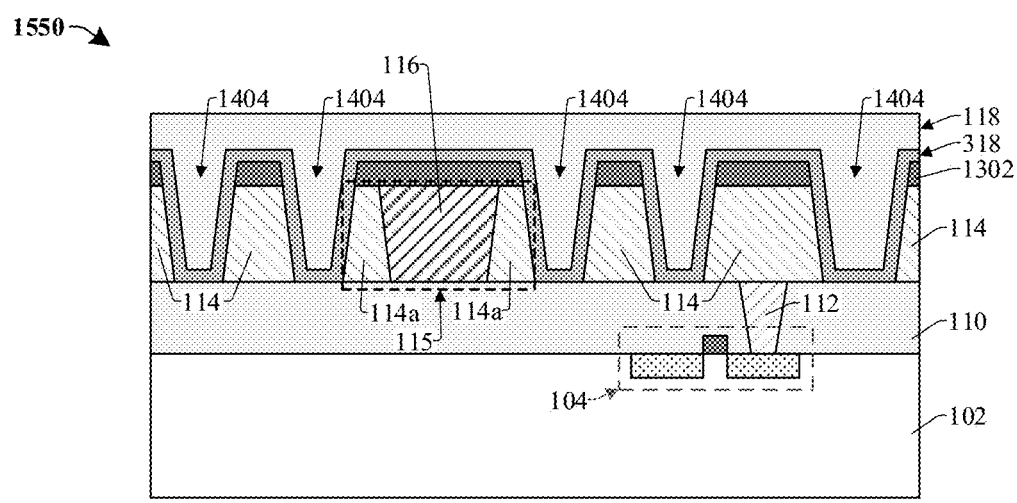

Alternatively, as shown in cross-sectional view 1550 of FIG. 15B, an ILD liner 318 may be conformally formed over the second hard mask 1302 and in the second openings 1404. The first ILD layer 118 may then be formed over the ILD liner 318. The ILD liner 318 may be formed by CVD, ALD, PVD, or the like.

Figure 16:
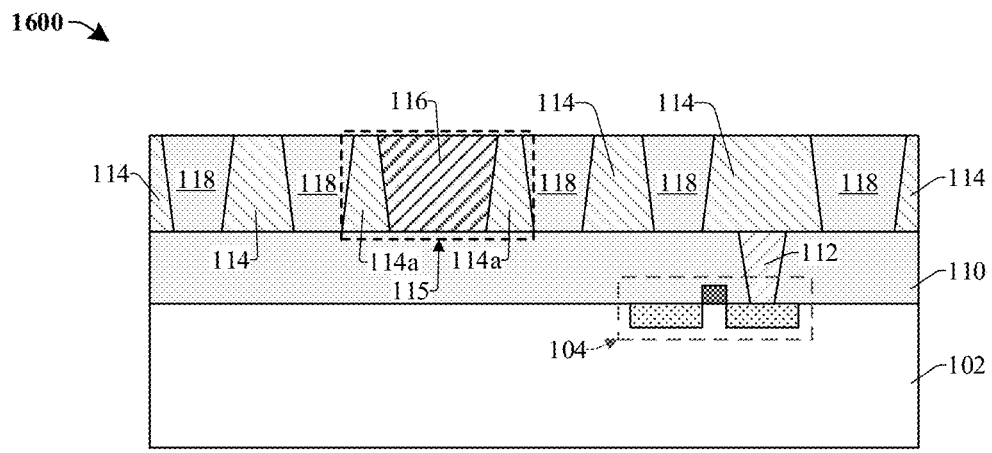

As shown in cross-sectional view 1600 of FIG. 16, a planarization process is performed on the first ILD layer 118 to remove the first ILD layer 118 and the second hard mask 1302 from over the first metal lines 114 and the hybrid metal line 115. In some embodiments, the planarization process may result in a top of the first ILD layer 118 being vertically aligned with tops of the first metal lines 114 and the hybrid metal line 115. The planarization process may, for example, comprise a CMP or the like.

Figure 17:
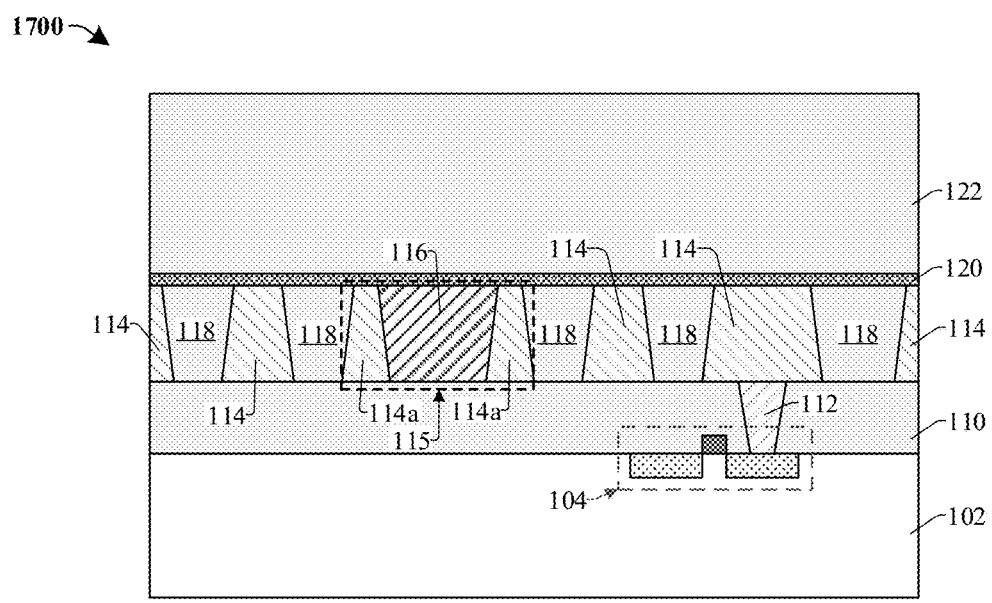

As shown in cross-sectional view 1700 of FIG. 17, an etch-stop layer 120 is formed over the first metal lines 114, the hybrid metal line 115, and the first ILD layer 118. In addition, a second ILD layer 122 is formed over the etch-stop layer 120. Any of the etch-stop layer 120 and the second ILD layer 122 may be formed by CVD, PVD, ALD, a spin-on process, or the like.

Figure 18:
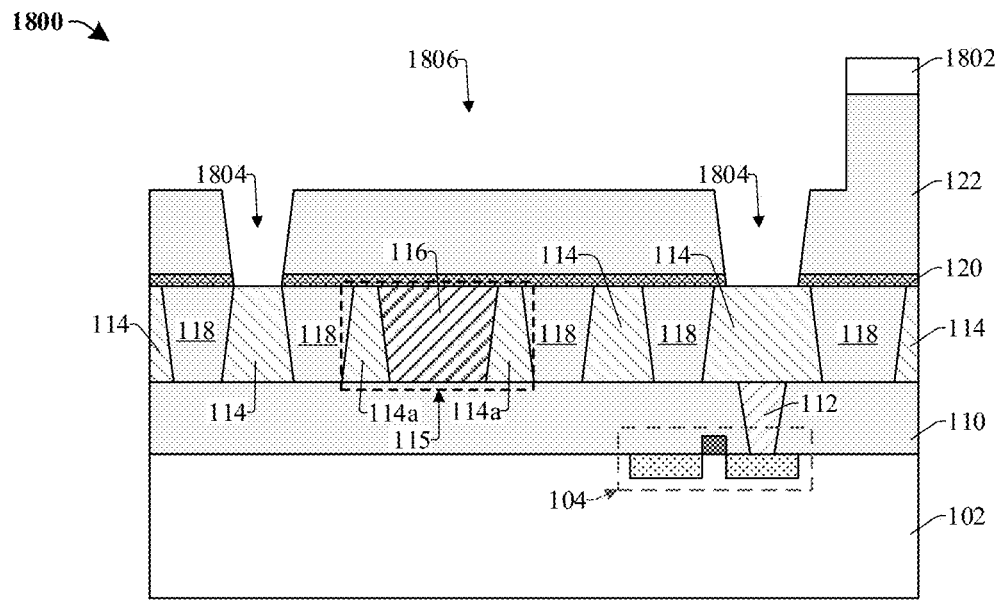

As shown in cross-sectional view 1800 of FIG. 18, a mask 1802 is formed over the second ILD layer 122. The second ILD layer 122 and the etch-stop layer 120 may then be patterned with the mask 1802 in place to form a plurality of via openings 1804 in the second ILD layer 122 and a trench opening 1806 in the second ILD layer 122 over the via openings 1804. The patterning may, for example, comprise any of a lithography process, a wet etching process, a dry etching process, or the like. In some embodiments, the mask 1802 may comprise photoresist or the like.

Figure 19:
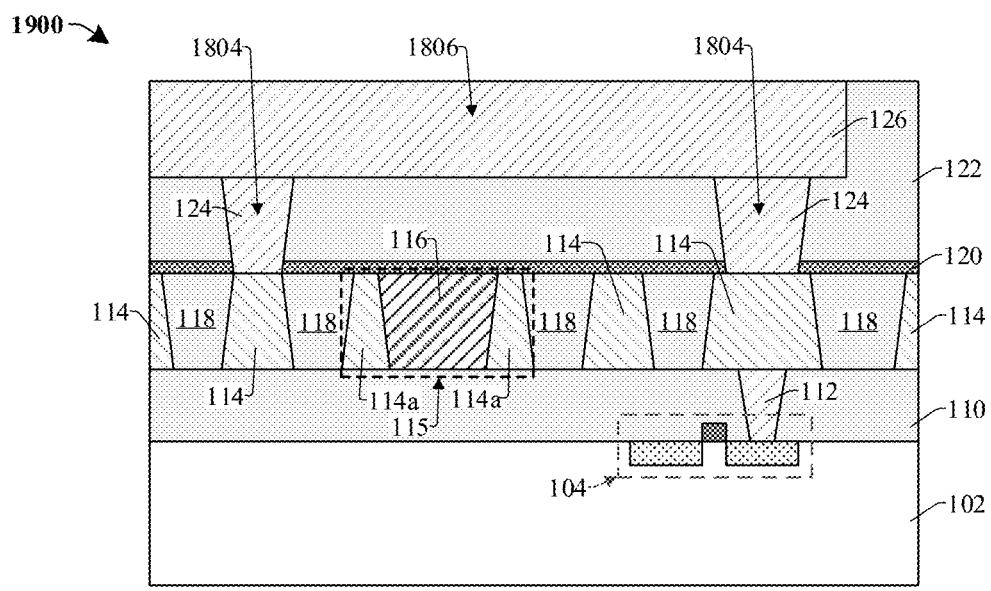

As shown in cross-sectional view 1900 of FIG. 19, one or more metal materials may be deposited in the via openings 1804 and the trench opening 1806 to form a plurality of vias 124 and a second metal line 126, respectively. The metal materials may be deposited, for example, by a sputtering process, an electroplating process, another suitable metal deposition process, or the like. In some embodiments, the metal material deposited in the via openings 1804 may be different than the metal material deposited in the trench opening 1806. Thus, the vias 124 and the second metal line 126 may comprise different metal materials.

Although FIGS. 18 and 19 illustrate forming the plurality of vias 124 and the second metal line 126 using a dual damascene process, it will be appreciated that the plurality of vias 124 and the second metal line 126 may be formed using a single damascene process (see, for example, FIG. 3) or a metal patterning process (see, for example, FIG. 7). Further, in some embodiments, the vias 124 may alternatively be formed by a bottom-up deposition process or the like to reduce a contact resistance at an interface between the vias 124 and the first metal lines 114. For example, a bottom-up deposition process may utilize an electroless deposition (ELD) process to selectively grow the via metal from the bottom of the vias 124 toward the top of the vias 124, and may subsequently comprise forming the second metal line 126 over the vias 124 by some other metal deposition process.

Further, although FIGS. 9-19 illustrate forming the second metal segment 116 before patterning the first metal material 902 with the second etching process and forming the first ILD layer 118 in the second openings 1404, it will be appreciated that in some alternative embodiments (not shown), the first metal material 902 may be patterned with the second etching process and the first ILD layer 118 may be formed in the second openings 1404 before the first metal material 902 is patterned with the first etching process and before the second metal segment 116 is formed (i.e., the second metal segment 116 may be formed after defining the plurality of first metal lines 114 with the second etching process and after forming the first ILD layer 118 between the first metal lines 114).

Figure 20:
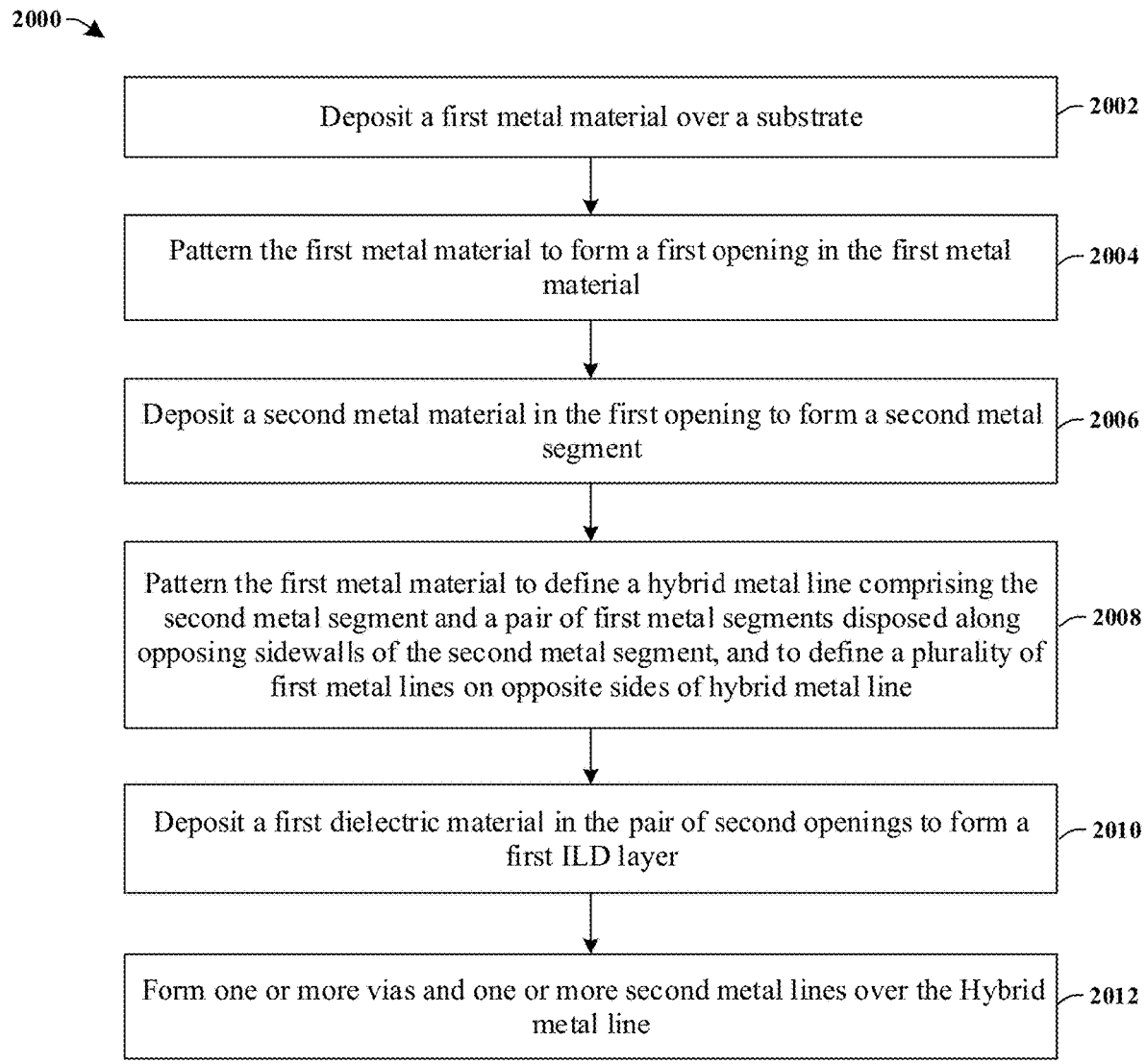
FIG. 20 illustrates a flow diagram of some embodiments of a method for forming an interconnect structure comprising a hybrid metal line.

FIG. 20 illustrates a flow diagram of some embodiments of a method 2000 for forming an interconnect structure comprising a hybrid metal line. While method 2000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2002, a first metal material is deposited over a substrate. FIG. 9 illustrates a cross-sectional view 900 of some embodiments corresponding to act 2002.

At 2004, the first metal material is patterned to form a first opening in the first metal material. FIG. 10 illustrates a cross-sectional view 1000 of some embodiments corresponding to act 2004.

At 2006, a second metal material is deposited in the first opening to form a second metal segment. FIG. 11 illustrates a cross-sectional view 1100 of some embodiments corresponding to act 2006.

At 2008, the first metal material is patterned to define a hybrid metal line, and to define a plurality of first metal lines on opposite sides of the hybrid metal line. The hybrid metal line comprises the second metal segment and a pair of first metal segments disposed along opposing sidewalls of the second metal segment. FIG. 14 illustrates a cross-sectional view 1400 of some embodiments corresponding to act 2008.

At 2010, a dielectric material is deposited in the pair of second openings to form a first ILD layer. FIG. 15 illustrates a cross-sectional view 1500 of some embodiments corresponding to act 2010.

At 2012, one or more vias and one or more second metal lines may be formed over the hybrid metal line. FIG. 19 illustrates a cross-sectional view 1900 of some embodiments corresponding to act 2012.

Although the method 2000 illustrates forming the second metal segment (e.g., 2006) before defining the first metal lines (e.g., 2008), it will be appreciated that in some alternative embodiments (not shown), the second metal segment may be formed after the first metal lines are defined.

Thus, the present disclosure relates to an integrated chip including an interconnect structure, the interconnect structure comprising a hybrid metal line for improving the performance of the integrated chip, and a method for forming the integrated chip.

Accordingly, in some embodiments, the present disclosure relates to an integrated chip comprising a substrate. A first metal line comprising a first metal material is disposed within a first interlayer dielectric (ILD) layer over the substrate. A hybrid metal line is disposed within the first ILD layer. The hybrid metal line comprises a pair of first metal segments comprising the first metal material and a second metal segment comprising a second metal material disposed laterally between the pair of first metal segments. The second metal material is different from the first metal material.

In other embodiments, the present disclosure relates to an interconnect structure comprising a plurality of first metal lines laterally spaced apart over a semiconductor substrate by a first interlayer dielectric (ILD) layer. The plurality of first metal lines comprise a first metal material. A hybrid metal line is over the semiconductor substrate and laterally separated from the plurality of first metal lines by the first ILD layer. The hybrid metal line comprises a second metal segment disposed over the semiconductor substrate. The second metal segment comprises a second metal material different from the first metal material. The hybrid metal line further comprises one or more first metal segments disposed on opposite sides of the second metal segment. The one or more first metal segments comprise the first metal material. Angles between bottom surfaces of the one or more first metal segments and inner sidewalls of the one or more first metal segments are less than 90 degrees and angles between a bottom surface of the second metal segment and sidewalls of the second metal segment are greater than 90 degrees.

In yet other embodiments, the present disclosure relates to a method for forming an interconnect structure. The method comprises depositing a first metal material over a substrate. The first metal material is patterned with a first etch to form a first opening in the first metal material. A second metal material different from the first metal material is deposited in the first opening to form a second metal segment between sidewalls of the first metal material that define the first opening. The first metal material is patterned with a second etch to form a plurality of second openings and to define a plurality of first metal lines. A first dielectric material is deposited in the plurality of second openings to form a first interlayer dielectric (ILD) layer between the plurality of first metal lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a substrate;
   a first metal line over the substrate, the first metal line comprising a first metal; and
   a hybrid metal line over the substrate and laterally spaced from the first metal line by a first dielectric layer, the hybrid metal line comprising:
      a second metal line comprising a second metal, different than the first metal; and
      a third metal line and a fourth metal line on opposite sides of the second metal line and coupled to the second metal line, the third metal line and the fourth metal line comprising the first metal, wherein a bottom surface of the third metal line is spaced from a bottom surface of the fourth metal line.

2. The integrated chip of claim 1, wherein the hybrid metal line has a first width along a bottom of the hybrid metal line and a second width, less than the first width, along a top of the hybrid metal line.

3. The integrated chip of claim 1, wherein a cavity is within the first dielectric layer and directly between the first metal line and the hybrid metal line.

4. The integrated chip of claim 1, further comprising:
   a first metal liner disposed along sidewalls and a lower surface of the second metal line, wherein the first metal liner is directly between the second metal line and the third metal line, and wherein the first metal liner is directly between the second metal line and the fourth metal line.

5. The integrated chip of claim 4, wherein the first metal liner extends directly between the bottom surface of the third metal line and the bottom surface of the fourth metal line.

6. The integrated chip of claim 1, wherein the second metal line extends directly between the bottom surface of the third metal line and the bottom surface of the fourth metal line.

7. The integrated chip of claim 1, wherein the bottom surface of the third metal line and the bottom surface of the fourth metal line are above a bottom surface of the second metal line.

8. The integrated chip of claim 1, further comprising:
   an adhesion layer disposed along the bottom surface of the third metal line and the bottom surface of the fourth metal line.

9. The integrated chip of claim 1, wherein the first dielectric layer comprises a first dielectric and a second dielectric, and wherein the first dielectric is on opposite sides of the second dielectric.

10. An integrated chip comprising:
    a substrate;
    a first metal line over the substrate, the first metal line comprising a first metal;
    a first dielectric layer over the substrate and beside the first metal line; and
    a hybrid metal line over the substrate and laterally spaced from the first metal line by the first dielectric layer, the hybrid metal line comprising:
       a first metal segment comprising a second metal, different from the first metal;
       a second metal segment on a first side of the first metal segment, the second metal segment comprising the first metal, wherein a top surface of the second metal segment has a first width and a bottom surface of the second metal segment has a second width; and
       a third metal segment on a second side of the first metal segment, opposite the first side, the third metal segment comprising the first metal, wherein a top surface of the third metal segment has a third width, greater than the first width, and a bottom surface of the third metal segment has a fourth width, greater than the second width.

11. The integrated chip of claim 10, wherein the bottom surface of the second metal segment is spaced from the bottom surface of the third metal segment.

12. The integrated chip of claim 11, wherein a bottom surface of the first metal segment is directly between the bottom surface of the second metal segment and the bottom surface of the third metal segment.

13. The integrated chip of claim 10, the hybrid metal line further comprising:
    a fourth metal segment directly between the second metal segment and the first metal segment, the fourth metal segment comprising a third metal, different from the first metal and the second metal; and
    a fifth metal segment directly between the third metal segment and the first metal segment, the fifth metal segment comprising the third metal.

14. The integrated chip of claim 13, wherein the fourth metal segment extends directly between the bottom surface of the second metal segment and a bottom surface of the first metal segment, and wherein the fifth metal segment extends directly between the bottom surface of the third metal segment and the bottom surface of the first metal segment.

15. The integrated chip of claim 14, wherein the first metal segment extends directly between a bottom surface of the fourth metal segment and a bottom surface of the fifth metal segment.

16. The integrated chip of claim 10, wherein a top surface of the first metal segment has a fifth width and a bottom surface of the first metal segment has a sixth width, wherein a sum of the first width, the third width, and the fifth width is less than a sum of the second width, the fourth width, and the sixth width.

17. An integrated chip comprising:
    a substrate;
    a first dielectric layer over the substrate;
    a first metal line over the substrate, the first metal line comprising a first metal; and
    a hybrid metal line over the substrate, the first dielectric layer between the hybrid metal line and the first metal line, the hybrid metal line comprising:
       a second metal line comprising a second metal, different than the first metal; and
       a third metal line and a fourth metal line on opposite sides of the second metal line and coupled to the second metal line, the third metal line and the fourth metal line comprising the first metal,
    wherein a width of the hybrid metal line along a bottom of the hybrid metal line is greater than a width of the hybrid metal line along a top of the hybrid metal line.

18. The integrated chip of claim 17, wherein a bottom surface of the second metal line has a first width and a top surface of the second metal line has a second width, greater than the first width, wherein a bottom surface of the third metal line has a third width and a top surface of the third metal line has a fourth width, less than the third width, and wherein a bottom surface of the fourth metal line has a fifth width and a top surface of the fourth metal line has a sixth width, less than the fifth width.

19. The integrated chip of claim 17, wherein a distance between an outer sidewall of the third metal line and an outer sidewall of the fourth metal line along top surfaces of the third metal line and the fourth metal line is less than a distance between the outer sidewall of the third metal line and the outer sidewall of the fourth metal line along bottom surfaces of the third metal line and the fourth metal line.

20. The integrated chip of claim 17, wherein a bottom surface of the third metal line has a first width and a bottom surface of the fourth metal line has a second width, greater than the first width.

* * * * *